United States Patent [19]

Huffman

[11] Patent Number: 5,191,510
[45] Date of Patent: Mar. 2, 1993

[54] USE OF PALLADIUM AS AN ADHESION LAYER AND AS AN ELECTRODE IN FERROELECTRIC MEMORY DEVICES

[75] Inventor: Maria Huffman, Colorado Springs, Colo.

[73] Assignee: Ramtron International Corporation, Colorado Springs, Colo.

[21] Appl. No.: 875,749

[22] Filed: Apr. 29, 1992

[51] Int. Cl.[5] .................. H01G 4/06; H01G 4/10; H01L 27/02; G11C 11/22
[52] U.S. Cl. .................. 361/313; 361/321; 365/145; 257/295
[58] Field of Search ............... 361/311–313, 361/303–305, 320, 321; 357/51; 29/25.42; 264/61; 365/145, 149; 437/47, 52

[56] References Cited

U.S. PATENT DOCUMENTS

| 3,184,660 | 5/1965 | Robinson | 361/313 |
|---|---|---|---|
| 3,569,802 | 3/1971 | Brauer et al. | 357/10 |
| 3,579,063 | 5/1971 | Wasa et al. | 361/313 |
| 3,819,990 | 5/1974 | Hayashi et al. | 361/313 |
| 4,149,301 | 4/1979 | Cook | 29/25.42 |
| 4,149,302 | 4/1979 | Cook | 29/29.42 |
| 4,636,908 | 1/1987 | Yoshihara et al. | 361/321 |
| 4,707,897 | 11/1987 | Rohrer et al. | 29/25.42 |
| 4,809,225 | 2/1989 | Dimmler et al. | 365/145 |
| 4,853,893 | 8/1989 | Eaton, Jr. et al. | 365/145 |
| 4,873,664 | 10/1989 | Eaton, Jr. et al. | 365/145 |
| 4,888,733 | 12/1989 | Mobley | 365/145 |
| 4,893,272 | 1/1990 | Eaton, Jr. et al. | 365/145 |
| 4,910,708 | 3/1990 | Eaton, Jr. et al. | 365/145 |
| 4,914,627 | 4/1990 | Eaton, Jr. et al. | 365/145 |
| 4,918,654 | 4/1990 | Eaton, Jr. et al. | 365/145 |
| 4,982,309 | 1/1991 | Shepherd | 361/321 |
| 5,003,428 | 3/1991 | Shepherd | 361/321 |
| 5,005,102 | 4/1991 | Larson | 361/313 |
| 5,024,964 | 6/1991 | Rohrer et al. | 437/47 |
| 5,046,043 | 9/1991 | Miller et al. | 365/145 |
| 5,122,923 | 6/1992 | Matsubara et al. | 361/321 |

OTHER PUBLICATIONS

S. F. Vogel and I. C. Barlow, *Sputtered Platinum as Substrate for Ferroelectric Film Deposition*, J. Vac. Sci. Technol., vol. 10, No. 5, Sep./Oct. 1973.

Patent Interference No. 100,842, Rohrer et al. v. Cook.

Chin-An Chang, *Deposition of* (100) *Au, Ag, Pt, Pb, and Fe on* (100) *Si Using Differential Metal Seed Layers*, J. Vac. Sci. Technol. A, vol. 9, No. 1, Jan./Feb. 1991.

Primary Examiner—Donald A. Griffin
Attorney, Agent, or Firm—Edward D. Manzo; Mark J. Murphy

[57] ABSTRACT

A ferroelectric capacitor for a ferroelectric memory device includes a substrate, a silicon dioxide layer, a palladium adhesion layer, a bottom electrode of platinum, a metal or an alloy, a ferroelectric material and a top electrode of platinum, a metal or an alloy.

26 Claims, 4 Drawing Sheets

USE OF PALLADIUM AS AN ADHESION LAYER AND AS AN ELECTRODE IN FERROELECTRIC MEMORY DEVICES

BACKGROUND OF THE INVENTION

The present invention relates to the use of palladium (Pd) in ferroelectric memory devices and in particular, ferroelectric capacitors.

Ferroelectric capacitors are of interest today because of their use in ferroelectric memories and thin film discrete capacitors. See U.S. Pat. Nos. 4,873,664; 4,809,225; 4,853,893; 4,918,654; 4,910,708; 4,914,627; 4,893,272; 4,888,733, all issued to Ramtron Corporation of Colorado Springs, Colo., USA.

Platinum (Pt) electrodes are often used in the fabrication of ferroelectric capacitors. Unfortunately, currently a number of problems exist with the use of these Pt electrodes in ferroelectric capacitors, not the least of which is the high cost of platinum.

Ferroelectric capacitors are fabricated using an oxide known as "PZT" which refers generally to a mixture or solution comprised of oxides of lead, zirconium and titanium, forming a perovskite structure. The PZT is sandwiched between electrodes typically comprised of noble metals, termed lower and upper electrodes. The lower electrode may be deposited directly on silicon dioxide or some other suitable dielectric. When using Pt (or another noble metal) in the fabrication of a ferroelectric capacitor, the adhesion at the interface between the Pt or other noble metal and the dielectric is poor. If there is poor adhesion at this interface, delamination can potentially occur between the electrode and the dielectric. In addition, the adhesion of the electrode/dielectric/electrode to the substrate is also poor. The substrate typically comprises silicon covered with a layer of silicon dioxide which has a thickness in the range between 5,000 Å (500 nm) and 8,000 Å (800 nm).

Presently, one approach for solving this adhesion problem is to use titanium (Ti) or chromium (Cr) under the Pt as a "glue" layer. However, both Ti and Cr can readily diffuse through the Pt. If the Ti or Cr does diffuse through the Pt and is able to reach the PZT interface, the Ti or Cr will oxidize and will result in the degradation of the electrical properties of the capacitor.

One possible solution to the adhesion problem between the electrodes and the dielectric is disclosed in Ramtron's co-pending U.S. patent application Ser. No. 07/714,682, entitled "Conducting Electrode Layers For Ferroelectric Capacitors In Integrated Circuits And Method" which is incorporated herein by reference.

Accordingly, the main object of the present invention is to create a ferroelectric capacitor structure that overcomes the deficiencies of the prior devices.

SUMMARY OF THE INVENTION

The present invention in one of its aspects is directed to a ferroelectric capacitor for use in ferroelectric memory devices. In particular, the present invention is directed to the use of palladium or an alloy of platinum and another metal in the ferroelectric capacitor.

In a first embodiment of the present invention, an adhesion layer, comprised of palladium, is located over a silicon dioxide layer which is over a substrate. A bottom electrode, a layer of ferroelectric material and a top electrode are located over the adhesion layer. The palladium adhesion layer adheres to the silicon dioxide layer while providing a good interface with the bottom electrode.

In a second embodiment, an adhesion layer is located over a substrate. A silicon dioxide layer is located between the substrate and the adhesion layer. A bottom electrode, comprising an alloy of platinum and another metal, is located over the adhesion layer. A layer of ferroelectric material and a top electrode are located over the bottom electrode. The top electrode comprises an alloy of platinum and a metal.

In a third embodiment, an adhesion layer is located over the substrate. A silicon dioxide layer is located between the substrate and the adhesion layer. A bottom electrode structure, comprising multiple layers of palladium and platinum, is located over the adhesion layer. A layer of ferroelectric material and a top electrode, comprising multiple layers of palladium and platinum, are located over the bottom electrode. The multiple layers of both the top and bottom electrode comprise two separate layers of platinum, over a layer of palladium. A further layer of palladium can be located between the two platinum layers.

In a fourth embodiment, an adhesion layer is located over the substrate. A silicon dioxide layer is located between the substrate and the adhesion layer. A bottom electrode structure, comprising multiple layers of palladium and platinum, is located over the adhesion layer. A layer of ferroelectric material and a top electrode, comprising multiple layers of palladium and platinum, are located over the bottom electrode. The multiple layers of both the top and bottom electrode can comprise two layers of platinum separated by a layer of palladium.

The present invention is further directed to a method for forming a ferroelectric capacitor. In general, the method comprises a number of steps wherein an adhesion layer is established over a substrate, and a bottom electrode, a layer of ferroelectric material and a top electrode are established over the adhesion layer and patterned and annealed.

BRIEF DESCRIPTION OF THE DRAWINGS

In describing the preferred embodiment, reference is made to the accompanying drawings wherein like parts have like reference numerals, and wherein.

DETAILED DESCRIPTION OF THE PRESENTLY PREFERRED EMBODIMENTS

FIGS. 1(a)-(e) illustrate the steps of a method for fabricating a ferroelectric capacitor having an adhesion layer comprised of palladium, according to a first embodiment of the present invention. Substrate 10 comprises the first layer of the structure. Typically, substrate 10 will be comprised of single crystal or polycrystalline silicon but could be any other common substrate such as glass, gallium arsenide, etc. Substrate 10 may include a gate electrode 12. A silicon dioxide layer 20 can then be established over substrate 10. Layer 20 can be established by wet and dry oxidation or by a variety of physical and chemical deposition techniques which are known in the art. Layer 20 typically has a thickness of 5,000 Å (500 nm) to 8,000 Å (800 nm).

Figure 1A:
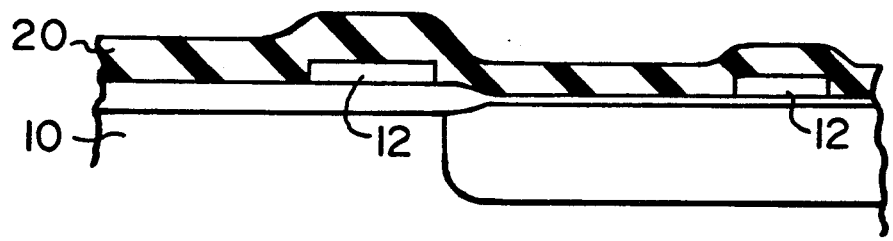
FIG. 1(a) is a cross-sectional view of a portion of a ferroelectric capacitor according to a first embodiment of the present invention showing a silicon dioxide layer over a substrate.
Figure 1B:
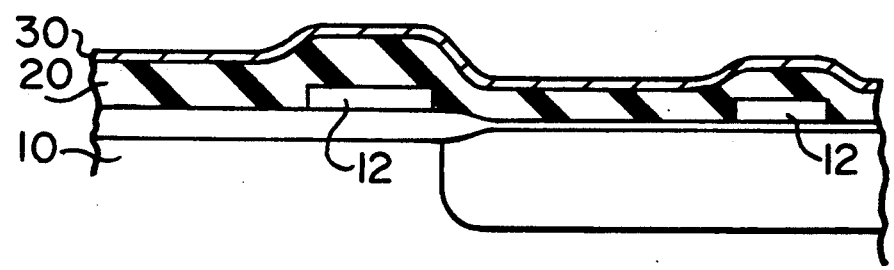
FIG. 1(b) shows the structure of FIG. 1(a) with an adhesion layer over the silicon dioxide layer.

Next, an adhesion layer 30 is established by sputtering or other physical deposition methods over silicon dioxide layer 20, as shown in FIG. 1(b). Adhesion layer 30 typically has a thickness in the range of 100 Å (10 nm) to 200 Å (20 nm). In the preferred embodiment, adhesion layer 30 is comprised of sputtered palladium (Pd). Pd replaces titanium (Ti) which was used as the adhesion layer in the prior devices. Pd is not as reactive as Ti and minimizes the high reactivity that is observed with Ti during device processing, such as the formation of titanium oxide between the electrode and the ferroelectric material. When adhesion layer 30 is comprised of Pd, the Pd forms an oxide which adheres to the silicon dioxide. In addition, since the lattice structure of Pd matches very well with that of Pt, the interface between the Pt electrode and the adhesion layer is very good.

Figure 1C:
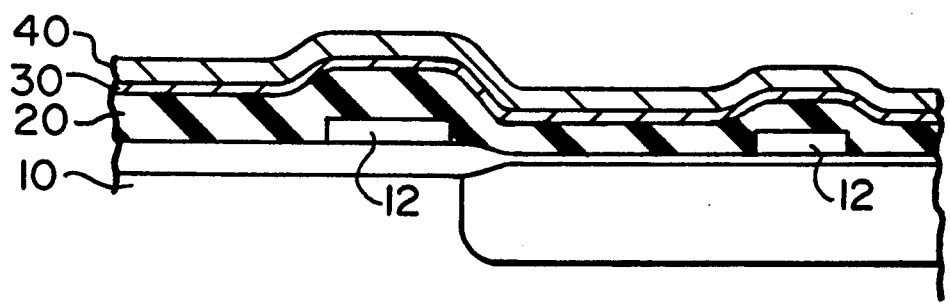
FIG. 1(c) shows the structure of FIG. 1(b) with a bottom electrode over the adhesion layer.

As shown in FIG. 1(c), a bottom electrode 40 is then established over adhesion layer 30. Bottom electrode 40 is established by sputtering for example. Typically, bottom electrode 40 is comprised of a noble metal. Preferably, electrode 40 is comprised of platinum (Pt). However, electrode 40 could also be comprised of an alloy of Pt and another metal, see infra. The thickness of electrode 40 is in the range from 1,000 Å (100 nm) to 4,000 Å (400 nm).

After layer 40 is deposited, the layer can be annealed. If annealed, a rapid thermal anneal (RTA) for no longer than 20 seconds in an inert atmosphere, such as Argon for example, is preferably used. However, it is not necessary to anneal layer 40 for the capacitor to work satisfactorily.

Figure 1D:
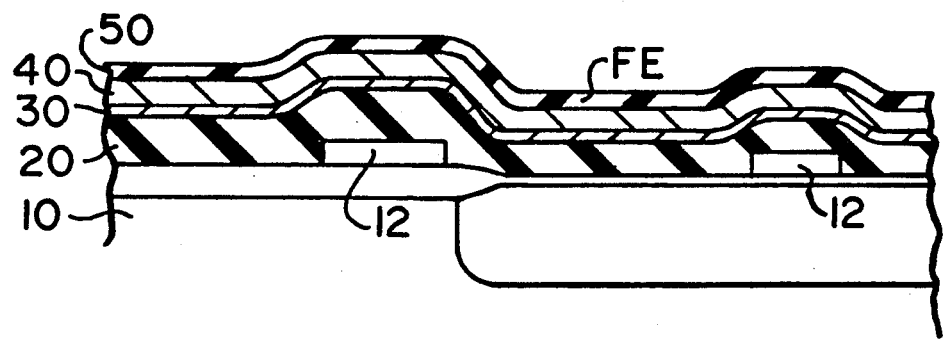
FIG. 1(d) shows the structure of FIG. 1(c) with a layer of ferroelectric material over the bottom electrode.

A dielectric 50 is then established over electrode 40, as shown in FIG. 1(d). Dielectric 50 can be comprised of a ferroelectric material, such as, for example, a compound comprising lead zirconate titanate, called "PZT", and having the general formula $Pb(Ti_xZr_{1-x})O_3$. The $Pb(Ti_xZr_{1-x})O_3$ stoichiometry can be in the range from $X=1$ to $X=0.1$ and may include a variety of dopants. Dielectric 50 is established by sputtering for example (or sol-gel methods or a variety of other techniques), and has a thickness between 1,000 Å (100 nm) to 4,000 Å (400 nm).

After layer 50 is deposited, the structure has to be annealed in order to form the ferroelectric pervoskite phase since, in the as-deposited state, the dielectric is amorphous. The annealing should be in oxygen. A RTA process can be used at a temperature between 500° C. and 850° C. for between 5 seconds and 60 seconds. A furnace could also be used at a temperature between 500° C. to 750° C. for between 15 minutes and 60 minutes. Either process will produce acceptable results.

Figure 1E:
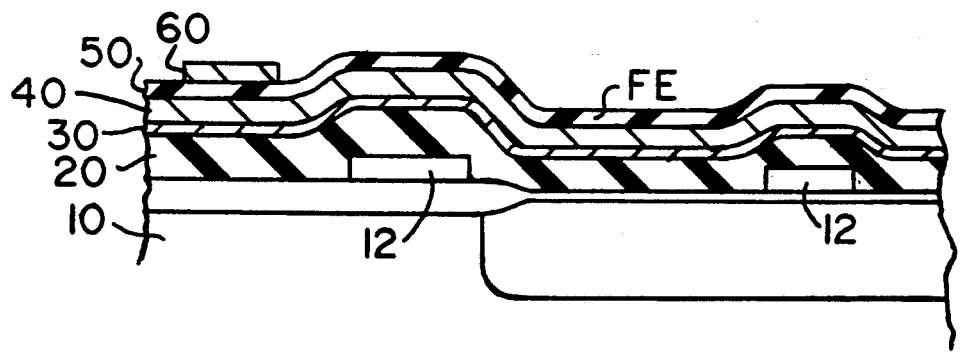
FIG. 1(e) shows the structure of FIG. 1(d) with a patterned top electrode over the layer of ferroelectric material.

A top electrode 60 is then established over dielectric 50. Top electrode 60 can be established by sputtering, for example. Electrode 60 preferably is comprised of a noble metal, such as platinum, for example. However, other noble metals or alloys of such noble metals can be used. Electrode 60 has a thickness in the range between 1,000 Å (100 nm) to 4,000 Å (400 nm). Top electrode 60 is then patterned. Electrode 60 can be patterned by ion milling, plasma etching or wet etching, for example. The resulting cross-sectional structure is shown in FIG. 1(e).

After top electrode 60 has been deposited and patterned, the whole structure should be annealed. Either RTA or furnace annealing can be used. The atmosphere needs to be oxidizing. If a RTA process is used, the temperature can be between 500° C. and 850° C. for between 5 seconds to 60 seconds. If a furnace anneal is used, the temperature can be between 500° C. and 750° C. for between 15 and 60 minutes.

Figure 1F:
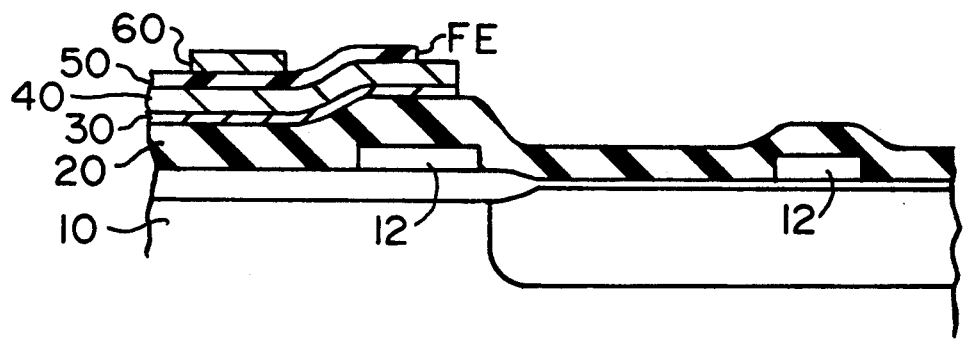
FIG. 1(f) shows that structure of FIG. 1(e) after the dielectric and bottom electrode have been patterned.

Thereafter, dielectric 50 is patterned by ion milling, plasma etching or wet etching, for example. Bottom electrode 40 is then patterned in a similar manner as dielectric 50. FIG. 1(f) shows the resulting structure.

In a method for forming the second embodiment of the present invention, a substrate 10, a gate electrode 12 and a silicon dioxide layer 20 are formed in a manner similar to that shown in FIG. 1(a) for the method for forming the first embodiment. FIGS. 2(a)-2(d) show the remaining steps for the method for fabrication of the capacitor of the third embodiment.

Figure 2A:
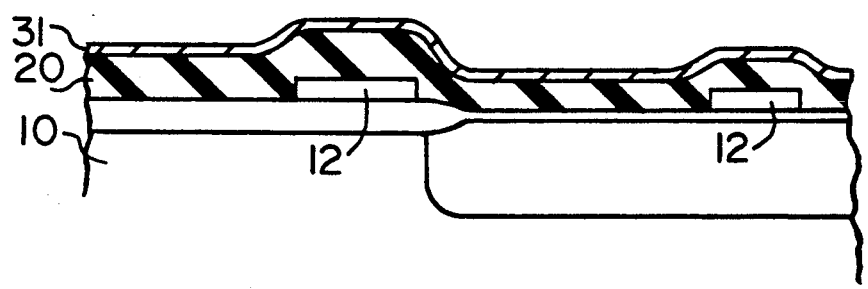
FIG. 2(a) is a cross-sectional view of a portion of a ferroelectric capacitor according to a second embodiment of the present invention showing an adhesion layer over a silicon dioxide layer over a substrate.

An adhesion layer 31 is established over layer 20, as shown in FIG. 2(a). Adhesion layer 31 can be comprised of, for example, Ti, as in the prior devices, or Pd, as is disclosed in the first embodiment of the present invention. Layer 31 can be established by sputtering, for example and has a thickness between 100 Å (10 nm) and 200 Å (20 nm).

Figure 2B:
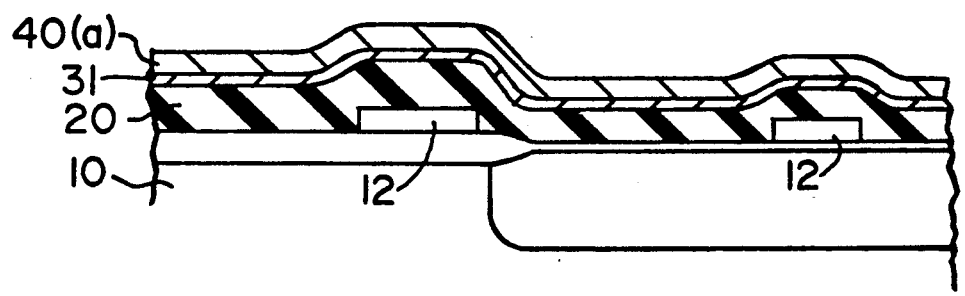
FIG. 2(b) shows the structure of FIG. 2(a) with a bottom electrode over the adhesion layer.

A bottom electrode 40(a) is then established over layer 31, as shown in FIG. 2(b). Bottom electrode 40(a) is established by sputtering, for example. Electrode 40(a) is preferably comprised of an alloy of Pt and some other metal. Electrode 40(a) can be either sputtered from a single metallic target with the desired composition or co-sputtered from two targets in the same sputtering machine. Care must be taken when co-sputtering is used to ensure that the desired composition is achieved. Electrode 40(a) can be annealed in a manner similar to that for the bottom electrode of the first embodiment. Examples of metals which can be used as alloys with Pt in electrode 40(a) include palladium (Pd), rhodium (Rh), iridium (Ir), nickel (Ni), osmium (Os), ruthenium (Ru), copper (Cu), and tungsten (W). However this is not a complete list and other metals may also be successfully utilized as alloys with Pt. In a preferred embodiment, the alloy comprises Pt and less than 10% of Pd in Pt since this composition will avoid oxidation.

By using an alloy of Pt and another metal, the amount of Pt needed in the electrode is reduced which, because of the high cost of Pt, reduces the cost of the capacitor. Further, using such an alloy will affect the electrical resistivity of the electrode. For example, the resistivity of pure Pt would be 106 nΩm at 20° C. However, an alloy of Pt and Ir (Pt-10%Ir) would increase the resistivity to 250 nΩm at 20° C. As a result, up to 10% of Pd, Rh or Ir can be used in an alloy with Pt while still having the acceptable resistivity. The same effect can be achieved for an alloy of Pt and 4% of Os or Ni, or 2% of Ru, W or Cu.

One of the limitations, however, of using an alloy of Pt and another metal is due to the selective oxidation of the metals at high oxidizing temperatures which are often present during ferroelectric processing. For example, palladium oxide is stable between 400° C. and 750° C. However, at over 750° C., it decomposes. performance under oxidizing conditions. It is therefore necessary, when using an alloy of Pt and another metal, to keep annealing temperatures reasonable so as to minimize electrode degradation.

Figure 2C:
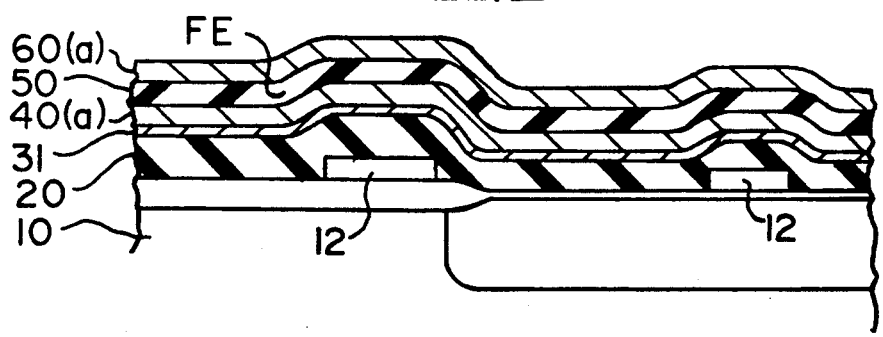
FIG. 2(c) shows the structure of FIG. 2(b) with a layer of ferroelectric material and top electrode over the bottom electrode.
Figure 2D:
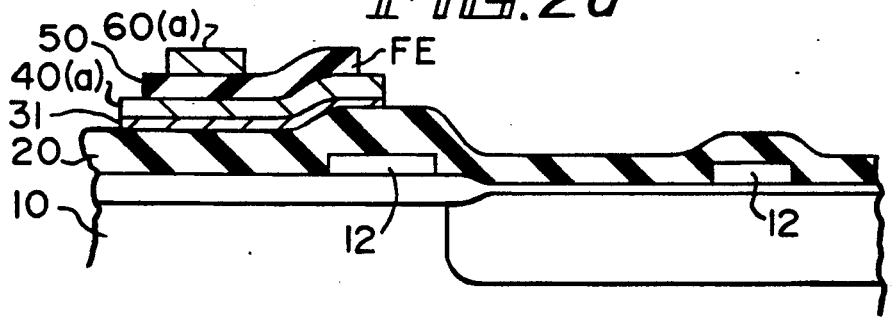
FIG. 2(d) shows the structure of FIG. 2(c) after the layers have been patterned.

A dielectric 50, preferably comprising a layer of ferroelectric material such as that described in the first embodiment, is then established over layer 40(a). Preferably, dielectric 50 has a thickness between 1,000 Å (100 nm) and 4,000 Å (400 nm). Dielectric 50 is then annealed in a manner similar to that described for the first embodiment. A top electrode 60(a) is then established over dielectric 50, as shown in FIG. 2(c). Layer 60(a) can be established by and comprise similar materials as that disclosed for layer 40(a) and has a similar thickness. However, layer 60(a) need not comprise the same materials as layer 40(a). Layers 60(a), 50 and 40(a) are patterned, and the structure is then annealed in a manner similar to that described for the first embodiment. FIG. 2(d) shows the resulting structure.

In the method for forming the third embodiment of the present invention, as shown in FIG. 2(a), a substrate 10, a gate electrode 12, a silicon dioxide layer 20, and an adhesion layer 31 are established, as previously described in the method for forming the second embodiment. Adhesion layer 31 is comprised of sputtered Ti with same thickness as adhesion layer 30 in the first embodiment.

Figure 3A:
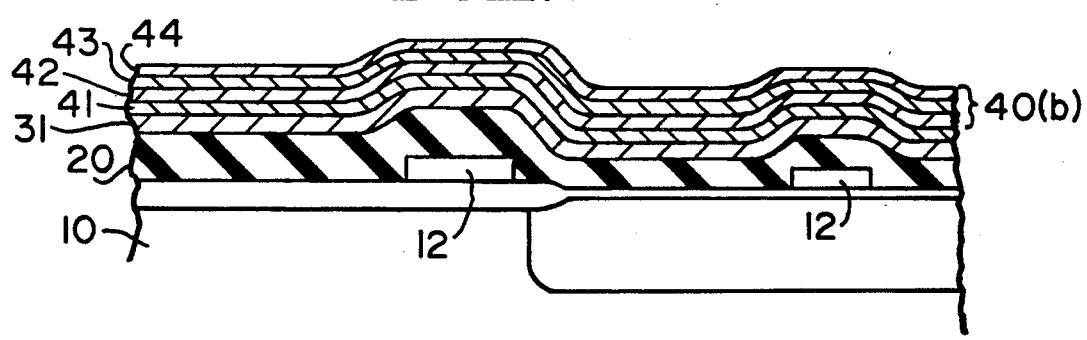
FIG. 3(a) is a cross-sectional view of a portion of a ferroelectric capacitor according to a third embodiment of the present invention showing a bottom electrode structure over an adhesion layer over a silicon dioxide layer over a substrate.

A bottom electrode structure 40(b) is then formed over layer 31. Structure 40(b) is formed by initially establishing a first layer 41, comprised of Pd, over layer 31. First layer 41 is established by sputtering, for example and has a thickness between 100 Å (10 nm) and 200 Å (20 nm). A second layer 42, comprised of Pt, is then established over layer 41. Second layer 42 is established by sputtering, for example and has a thickness between 100 Å (10 nm) and 200 Å (20 nm). A third layer 43, comprised of palladium, can then be established over layer 42. Third layer 43 is optional and need not be fabricated for successful operation of the capacitor of the present invention. Layer 43 can be established by sputtering, for example and has a thickness between 100 Å (10 nm) and 200 Å (20 nm). A fourth layer 44, comprised of Pt, is then established over layer 43 (or layer 42 if layer 43 is omitted). Layer 44 can be established by sputtering, for example and has a thickness of between 1,000 Å (100 nm) and 3,000 Å (300 nm). FIG. 3(a) shows the resulting structure.

After the deposition of the bottom electrode structure, the structure may be annealed in a manner similar to that described for the bottom electrode of the first embodiment. Palladium is used in the bottom electrode structure to improve adhesion and to lower the cost of the structure. Rh, Ir, Ni, Os, Ru, Cu or W could be substituted for the Pd in the bottom electrode structure.

A layer of ferroelectric material 50 is then established over bottom electrode 40(b). Layer 50 is established and annealed in a similar manner as that disclosed in the method for forming the first embodiment.

Figure 3B:
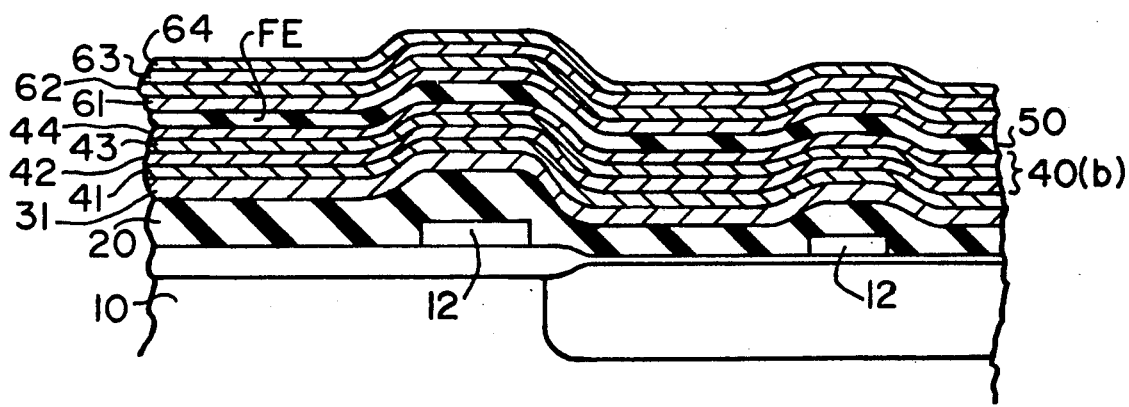
FIG. 3(b) shows the structure of FIG. 3(a) with a layer of ferroelectric material over the bottom electrode structure and a top electrode structure over the layer of ferroelectric material.

A top electrode 60(b) is then established over layer 50. Top electrode 60(b) preferably comprises a fifth layer 61, comprised of Pd, with a thickness between 100 Å (10 nm) to 200 Å (20 nm), a sixth layer 62, comprised of Pt, with a thickness between 100 Å (10 nm) to 200 Å (20 nm), an optional seventh layer 63 comprised of Pd with a thickness between 100 Å (10 nm) to 200 Å (20 nm) and an eighth layer 64 comprised of Pt with a thickness between 1,000 Å (100 nm) and 3,000 Å (300 nm) as shown in FIG. 3(b).

Figure 3C:
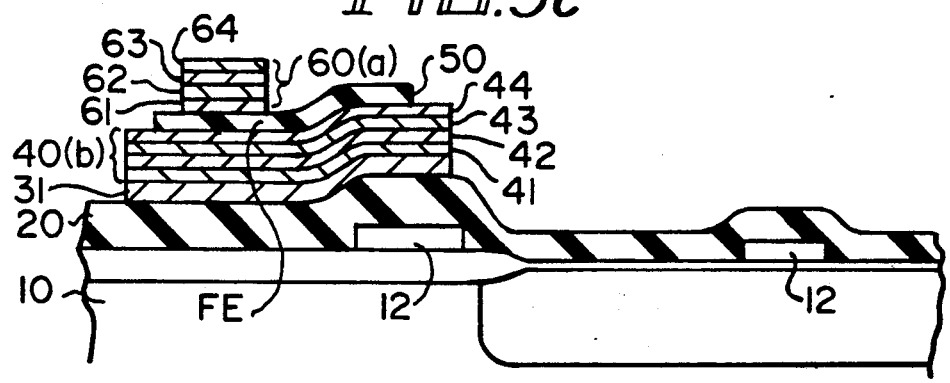
FIG. 3(c) shows the structure of FIG. 3(b) after the layers have been patterned.

After deposition of the top electrode structure, the entire structure can be annealed and patterned as described previously for the first embodiment. FIG. 3(c) shows the resulting structure. Rh, Ir, Ni, Os, Ru, Cu or W could be substituted for the Pd in the top electrode.

In this embodiment, ferroelectric material 50 is immediately sandwiched between Pt (layer 44) and Pd (layer 62) which creates asymmetric interfaces. Asymmetric ferroelectric application Ser. No. 07/853,901, filed Mar. 19, 1992 and entitled "A Method For Increasing The Dielectric Constant Of Integrated Ferroelectric Capacitors" which is incorporated herein by reference.

In the method for forming the fourth embodiment of the present invention, as shown in FIG. 2(a), a substrate 10, a silicon dioxide layer 20 and adhesion layer 31 are formed, as previously described in the method for forming the third embodiment.

Figure 4A:
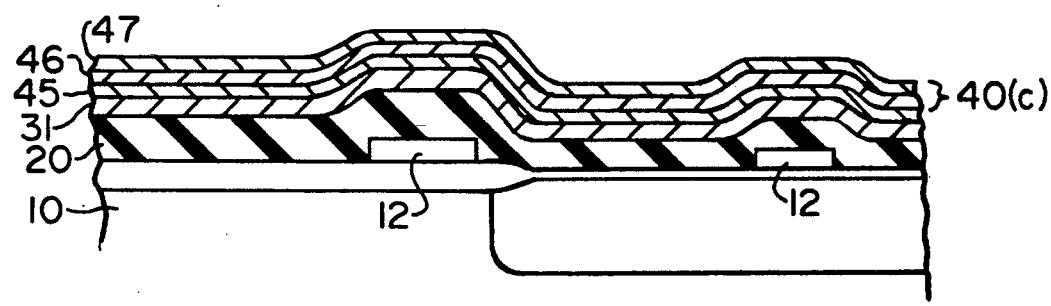
FIG. 4(a) is a cross-sectional view of a portion of a ferroelectric capacitor according to a fourth embodiment of the present invention showing a bottom electrode structure over an adhesion layer over a silicon dioxide layer over a substrate.

A bottom electrode structure 40(c) is then formed over layer 31. Structure 40(c) is preferably comprised of a first layer 45, comprised of Pt, having a thickness between 100 Å (10 nm) to 200 Å (20 nm), a second layer 46, comprised of Pd, having a thickness between 100 Å (10 nm) to 200 Å (20 nm) and a third layer 47, comprised of Pt, having a thickness between 1,000 Å (100 nm) to 3,000 Å (300 nm). The structure can then be annealed in a manner similar to that described previously for the first embodiment. FIG. 4(a) shows the resulting structure.

A layer of ferroelectric material 50 is then established over bottom electrode 40(c) and annealed, in a similar manner and with similar materials as previously described for the method for forming the first embodiment.

Figure 4B:
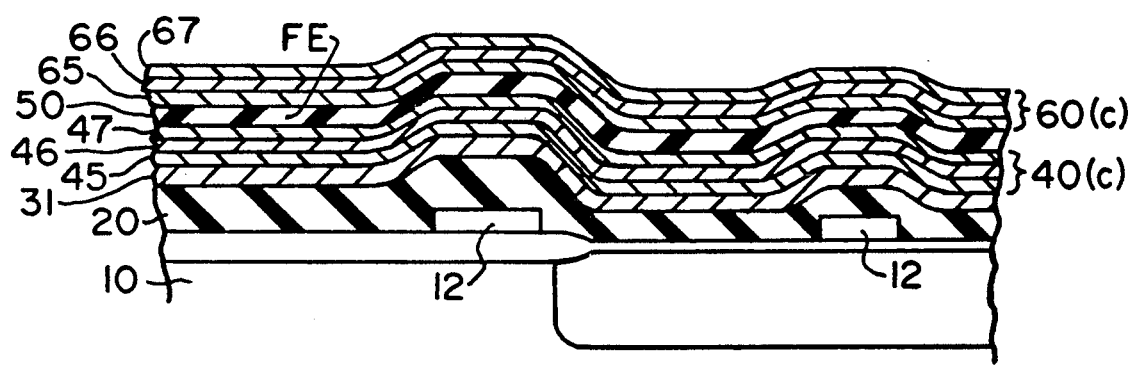
FIG. 4(b) shows the structure of FIG. 4(a) with a layer of ferroelectric material over the bottom electrode structure and a top electrode structure over the layer of ferroelectric material.
Figure 4C:
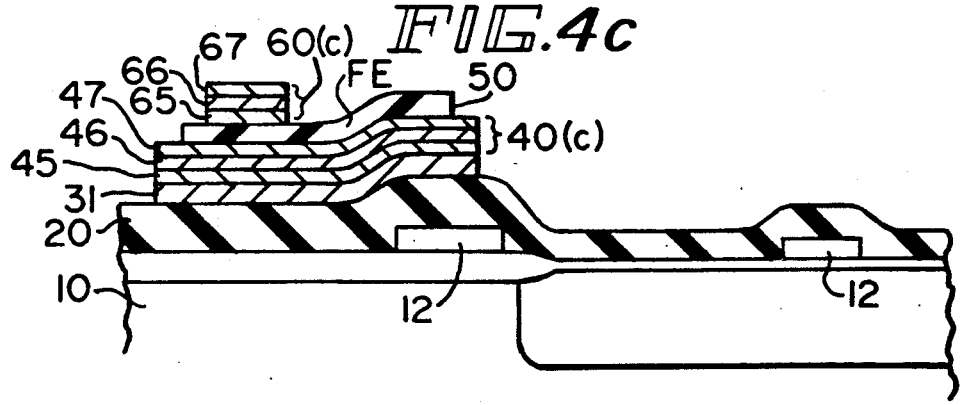
FIG. 4(c) shows the structure of FIG. 4(c) after the layers have been patterned.

A top electrode structure 60(c) is then established over layer 50. Top electrode 60(c) preferably comprises a fourth layer 65, comprised of Pt, with a thickness between 100 Å (10 nm) to 200 Å (20 nm), a fifth layer 66, comprised of Pd, having a thickness between 100 Å (10 nm) to 200 Å (20 nm) and a sixth layer 67, comprised of Pt, having a thickness between 1,000 Å (100 nm) to 3,000 Å (300 nm) as shown in FIG. 4(b). The structure can then be annealed and patterned in a similar manner to that described supra for the first embodiment. FIG. 4(c) shows the resulting structure.

This description has been offered for illustrative purposes only and is not intended to limit the invention of this application, which is defined in the claims below.

I claim:

1. A capacitor comprising:
a substrate;
a silicon dioxide layer located over said substrate;
an adhesion layer, comprising palladium, located over said silicon dioxide layer;
a bottom electrode located over said adhesion layer;
a layer of ferroelectric material located over said bottom electrode; and
a top electrode located over said layer of ferroelectric material.

2. The capacitor of claim 1 wherein said bottom electrode comprises platinum.

3. The capacitor of claim 1 wherein said bottom electrode comprises an alloy of platinum and a metal.

4. The capacitor of claim 1 wherein said metal is selected from the group comprising palladium, rhodium, iridium, nickel, osmium, ruthenium, copper and tungsten.

5. The capacitor of claim 1 wherein said bottom electrode comprises a first palladium layer, a first platinum layer over said first palladium layer, and a second platinum layer over said first platinum layer.

6. The capacitor of claim 5 further comprising a second palladium layer located between said first platinum layer and said second platinum layer.

7. The capacitor of claim 1 wherein said bottom electrode comprises a first platinum layer, a first palladium layer over said first platinum layer and a second platinum layer over said first palladium layer.

8. The capacitor of claim 1 wherein said ferroelectric material comprises a lead zirconate titanate composition defined by the chemical composition $Pb(Ti_xZr_{1-x})O_3$ wherein X is from 1 to 0.1.

9. The capacitor of claim 1 wherein said top electrode comprises platinum.

10. The capacitor of claim 1 wherein said top electrode comprises an alloy of platinum and a metal.

11. The capacitor of claim 10 wherein said metal is selected from the group comprising palladium, rhodium, iridium, nickel, osmium, ruthenium, copper and tungsten.

12. The capacitor of claim 1 wherein said top electrode comprises a first palladium layer, a first platinum layer over said first palladium layer, and a second platinum layer over said first platinum layer.

13. The capacitor of claim 12 further comprising a second palladium layer located between said first platinum layer and said second platinum layer.

14. The capacitor of claim 1 wherein said top electrode comprises a first platinum layer, a first palladium layer over said first platinum layer and a second platinum layer over said first palladium layer.

15. A capacitor comprising:
a substrate;
a silicon dioxide layer located over said substrate;
an adhesion layer located over said silicon dioxide layer;
a bottom electrode located over said adhesion layer, said bottom electrode comprising an alloy of platinum and a metal;
a layer of ferroelectric material located over said bottom electrode; and
a top electrode located over said layer of ferroelectric material, said top electrode comprising a second alloy of platinum and a metal.

16. The capacitor of claim 15 wherein said adhesion layer comprises palladium.

17. The capacitor of claim 15 wherein said adhesion layer comprises titanium.

18. The capacitor of claim 15 wherein said alloy in said bottom electrode comprises platinum and a metal selected from the group comprising palladium, rhodium, iridium, nickel, osmium, ruthenium, copper, and tungsten.

19. The capacitor of claim 15 wherein said ferroelectric material comprises a lead zirconate titanate composition defined by the chemical composition $Pb(Ti_xZr_{1-x})O_3$ wherein X is from 1 to 0.1.

20. The capacitor of claim 15 wherein said second alloy of said top electrode comprises platinum and a metal selected from the group comprising palladium, rhodium, iridium, nickel, osmium, ruthenium, copper, and tungsten.

21. A capacitor comprising:
a substrate;
a silicon dioxide layer located over said substrate;
an adhesion layer located over said silicon dioxide layer;
a bottom electrode structure located over said adhesion layer, said bottom electrode structure comprising a first palladium layer, a first platinum layer over said first palladium layer and a second platinum layer over said first platinum layer;
a layer of ferroelectric material located over said bottom electrode structure; and
a top electrode structure located over said layer of ferroelectric material, said top electrode structure comprising a second palladium layer, a third platinum layer over said second palladium layer and a fourth platinum layer over said third platinum layer.

22. The capacitor of claim 21 further comprising another palladium layer located between said first platinum layer and said second platinum layer.

23. The capacitor of claim 21 further comprising an additional palladium layer located between said third platinum layer and said fourth platinum layer.

24. The capacitor of claim 21 wherein said ferroelectric material comprises a lead zirconate titanate composition defined by the chemical composition $Pb(Ti_xZr_{1-x})O_3$ wherein X is from 1 to 0.1.

25. A capacitor comprising:
a substrate;
a silicon dioxide layer located over said substrate
an adhesion layer located over said silicon dioxide;
a bottom electrode structure located over said adhesion layer, said bottom electrode structure comprising a first platinum layer, a first palladium layer over said first platinum layer and a second platinum layer over said first palladium layer;

a layer of ferroelectric material located over said bottom electrode structure; and a top electrode structure located over said layer of ferroelectric material, said top electrode structure comprising a third platinum layer, a second palladium layer over said third platinum layer and a fourth platinum layer over said second palladium layer.

26. The capacitor of claim 25 wherein said ferroelectric material comprises a lead zirconate titanate composition defined by the chemical composition $Pb(Ti_xZr_{1-x})O_3$ wherein X is from 1 to 0.1.

* * * * *